United States Patent
Naruse (10) Patent No.: US 10,438,637 B2
(45) Date of Patent: Oct. 8, 2019

(54) MEMORY CONTROLLER

(71) Applicant: AISIN AW CO., LTD., Anjo-shi, Aichi-ken (JP)

(72) Inventor: Takanobu Naruse, Nishio (JP)

(73) Assignee: AISIN A W CO., LTD., Anjo-shi, Aichi-ken (JP)

( * ) Notice: Subject to any disclaimer, the term of this patent is extended or adjusted under 35 U.S.C. 154(b) by 0 days.

(21) Appl. No.: 16/061,076

(22) PCT Filed: Jan. 24, 2017

(86) PCT No.: PCT/JP2017/002392
§ 371 (c)(1),
(2) Date: Jun. 11, 2018

(87) PCT Pub. No.: WO2017/130983
PCT Pub. Date: Aug. 3, 2017

(65) Prior Publication Data
US 2018/0366168 A1    Dec. 20, 2018

(30) Foreign Application Priority Data
Jan. 25, 2016 (JP) ................. 2016-011737

(51) Int. Cl.
*G11C 7/00* (2006.01)
*G11C 7/22* (2006.01)
(Continued)

(52) U.S. Cl.
CPC .......... *G11C 7/222* (2013.01); *G06F 13/1689* (2013.01); *G06F 13/4234* (2013.01);
(Continued)

(58) Field of Classification Search
CPC .............. G11C 7/222; G11C 11/40611; G11C 11/4076; G11C 11/4093; G11C 11/4094;
(Continued)

(56) References Cited

U.S. PATENT DOCUMENTS 6,247,138 B1 * 6/2001 Tamura ................ G11C 7/1072
713/400
7,519,774 B2 * 4/2009 Katsuki ............... G06F 12/0875
345/557
(Continued)

FOREIGN PATENT DOCUMENTS

JP    2008-052335 A    3/2008
JP    2011-258134 A    12/2011
(Continued)

OTHER PUBLICATIONS

International Search Report of PCT/JP2017/002392 dated Apr. 4, 2017 [PCT/ISA/210].

*Primary Examiner* — Viet Q Nguyen
(74) *Attorney, Agent, or Firm* — Sughrue Mion, PLLC (57) ABSTRACT

There is provided a technique that makes it possible to ascertain a strobe point for data while a memory is in operation with actual data. A memory controller 1 includes a data skew adjustment part 2 that adjusts a data skew of a read data signal, a strobe adjustment part 3 that adjusts a strobe point, a data change point detection part 4 that detects a data change point, a strobe point detection part 5 that detects a strobe point, a dynamic timing calculation part 6 that calculates dynamic timing information for each read data signal, a dynamic timing information storage part 7 that stores the dynamic timing information, and a dynamic timing information output part 8 that outputs the dynamic timing information.

18 Claims, 8 Drawing Sheets

(51) Int. Cl.
*G11C 11/406* (2006.01)
*G11C 11/4076* (2006.01)
*G11C 11/4093* (2006.01)
*G11C 11/4094* (2006.01)
*G11C 11/4096* (2006.01)
*G06F 13/42* (2006.01)
*G06F 13/16* (2006.01)

(52) U.S. Cl.
CPC ...... *G11C 11/4076* (2013.01); *G11C 11/4093* (2013.01); *G11C 11/4094* (2013.01); *G11C 11/4096* (2013.01); *G11C 11/40611* (2013.01)

(58) Field of Classification Search
CPC . G11C 11/4095; G06F 12/00; G06F 13/1689; G06F 13/4234
USPC .................................................. 365/193, 191
See application file for complete search history.

(56) References Cited

U.S. PATENT DOCUMENTS

| | | | | |
|---|---|---|---|---|
| 7,567,880 B2 * | 7/2009 | Iizuka | ............. | G11C 7/1066 327/241 |
| 7,755,402 B1 * | 7/2010 | Ku | ............. | G06F 13/1689 327/12 |
| 8,040,721 B2 * | 10/2011 | Thorp | ............. | G11C 13/0004 365/148 |
| 8,081,527 B1 * | 12/2011 | Venkataraman | ... | G06F 13/1689 365/154 |
| 8,111,565 B2 * | 2/2012 | Kuroki | ............. | G11C 7/1006 365/189.14 |
| 8,526,249 B1 * | 9/2013 | Swanson | ............. | G11C 7/1066 365/193 |
| 8,725,976 B2 * | 5/2014 | Cho | ............. | G06N 20/00 711/167 |
| 8,902,693 B2 * | 12/2014 | Duffner | ............. | G11C 7/1009 365/233.1 |
| 8,941,423 B2 * | 1/2015 | Iyer | ............. | H03L 7/10 327/158 |
| 9,053,778 B2 * | 6/2015 | Ware | ............. | G06F 13/1684 |
| 9,147,463 B1 * | 9/2015 | Sarraju | ............. | G11C 11/4076 |
| 9,158,330 B1 * | 10/2015 | Bar-Lev | ............. | G06F 1/105 |
| 9,304,530 B1 * | 4/2016 | Ware | ............. | G06F 1/04 |
| 9,349,434 B1 * | 5/2016 | Lin | ............. | G11C 11/4096 |
| 9,601,171 B2 * | 3/2017 | Kim | ............. | G11C 7/222 |
| 9,607,672 B2 * | 3/2017 | Lin | ............. | G06F 13/1689 |
| 10,157,668 B2 * | 12/2018 | Whitaker | ............. | G11C 13/0064 |
| 10,236,051 B2 * | 3/2019 | Ware | ............. | G06F 13/1684 |
| 2005/0271179 A1 * | 12/2005 | Hasegawa | ......... | G01R 31/31922 375/371 |
| 2008/0048747 A1 | 2/2008 | Iizuka | | |
| 2010/0207650 A1 * | 8/2010 | Baba | ............. | G01R 31/31922 324/750.3 |
| 2012/0243351 A1 | 9/2012 | Ota et al. | | |
| 2014/0281198 A1 * | 9/2014 | Iyer | ............. | H03L 7/10 711/105 |
| 2019/0164583 A1 * | 5/2019 | Penney | ............. | G11C 7/222 |

FOREIGN PATENT DOCUMENTS

| | | |
|---|---|---|
| JP | 2012-203515 A | 10/2012 |
| JP | 2013-109637 A | 6/2013 |

* cited by examiner

MEMORY CONTROLLER

CROSS REFERENCE TO RELATED APPLICATIONS

This application is a National Stage of International Application No. PCT/JP2017/002392, filed Jan. 24, 2017, claiming priority based on Japanese Patent Application No. 2016-011737, filed Jan. 25, 2016, the contents of all of which are incorporated herein by reference in their entirety.

TECHNICAL FIELD

The present subject matter relates to a memory controller that controls write and read of data of a plurality of bits to and from a memory.

BACKGROUND ART

As disclosed in JP 2008-52335 A (Patent Literature 1), a semiconductor integrated circuit in which a memory, a logic circuit, and the like are integrated, such as one referred to as a system LSI, is often provided with a memory interface circuit (a memory controller) between the memory and the logic circuit. As exemplarily shown in FIGS. 1, 13, and others of Patent Literature 1, a data signal (DQ) output from a memory (3, 103) is latched by a capture circuit (12, 112) such as a register at timing (a strobe point) defined by a strobe signal (DQS) similarly provided by the memory (3, 103). The strobe point is preferably provided within a period in which the data signal is stable (which is referred to as a window, an eye, or the like) and not near a change point where the data signal changes.

However, a phase of a data signal or the strobe signal may vary as being influenced by an operating environment (a supply voltage, power consumption of the whole semiconductor integrated circuit, an ambient temperature, crosstalk noise of signals passing through nearby signal lines, and the like). Accordingly, the memory interface circuit is often includes an adjustment circuit for adjusting the phase of the data signal or the strobe signal. Patent Literature 1 exemplarily shows a configuration in which an interface circuit (10, 110) includes a variable delay circuit (13, 113) and a delay adjustment circuit (14, 114) for adjusting the phase of the strobe signal (DQS), and a configuration further including a fixed delay circuit (11) for adjusting the phase of the data signal (DQ). A set delay value for the delay adjustment circuit (14, 114) is set by calibration in which the memory (3, 13) and the interface circuit (10, 110) are operated in an adjustment mode at proper timing such as after product assembly, before shipment, or the like (see [0022] and others in Patent Literature 1). Note that, such calibration may be performed every time the semiconductor integrated circuit is turned ON, after test data have been stored in the semiconductor integrated circuit.

As disclosed in Patent Literature 1, in many cases, such calibration is performed in a special operation mode (for example, the above-described adjustment mode). Accordingly, for example when the semiconductor integrated circuit is actually in operation, it is difficult to ascertain such as how much margin (timing margin) is secured between a data signal (actual data) and the strobe point. Depending on the content of the actual data, most of a plurality of data signal lines transmitting data of a plurality of bits may simultaneously vary, inviting an increase in current consumption and in transition time, thereby shifting the phase of the change point. In such a case, a strobe point for a data signal may be set at an undesirable position. Therefore, to become capable of resetting the set delay value, determining whether adjustment is needed, and the like, preferably, such a timing margin and the like can be ascertained while the semiconductor integrated circuit is actually in operation.

Meanwhile, such a mode including a memory and a memory controller is not limited to the above-described system LSI (semiconductor integrated circuit), and may be a multichip module including a plurality of independent chips (including a mode where the chips share a package and each provided with an independent die). In such a mode, a memory chip and a memory controller independent from each other are used, and operate with reference to their respective different clock signals. In many cases, the memory chip includes a phase adjuster for adjusting the phase difference between the clock signal of the memory controller and the clock signal of the memory chip. However, a memory chip used in a smartphone with which recent years have seen proliferation often dispenses with such a phase adjuster to minimize power consumption and costs. Additionally, such a memory chip is relatively low in costs, benefited from mass production. Accordingly, in some cases, such a memory chip is applied to a product other than a smartphone. In such a case, it is more preferable to be capable of ascertaining how much margin (timing margin) is secured between a data signal (actual data) and a strobe point while a multichip module is actually in operation.

CITATIONS LIST

Patent Literature

Patent Literature 1: JP 2008-52335 A

SUMMARY

Technical Problems

In view of the background described above, it is desired to provide a technique that makes it possible to ascertain a strobe point for data while a memory is in operation with actual data.

Solutions to Problems

In view of the above, as one aspect, a memory controller that controls write and read of data of a plurality of bits to and from a memory includes: a timing adjustment part including a data skew adjustment part that adjusts a data skew being a phase difference between data signals, and a strobe adjustment part that adjusts a change point of a strobe signal that defines a strobe point by the change point of a signal; a data change point detection part that detects a data change point being a change point of each of the data signals; a strobe point detection part that detects the strobe point; a dynamic timing calculation part that calculates, for each of the data signals, dynamic timing information based on the strobe point and the change point of each of the data signals; a dynamic timing information storage part that stores the dynamic timing information; and a dynamic timing information output part that outputs the dynamic timing information.

In the present configuration, the data change point detection part and the strobe point detection part detect the data change point and the strobe point not in a special operation mode but in a normal operation mode in which the memory outputs actual data. Based on the data change point and the strobe point for the actual data, the dynamic timing information is calculated. Further, the dynamic timing information is stored, and is output from the memory controller. That is, the present configuration makes it possible to ascertain the strobe point for data while the memory is in operation with the actual data.

Additional features and advantages of the memory controller will become apparent from the following description that will be given with reference to the drawings.

DESCRIPTION OF EMBODIMENTS

Figure 1:
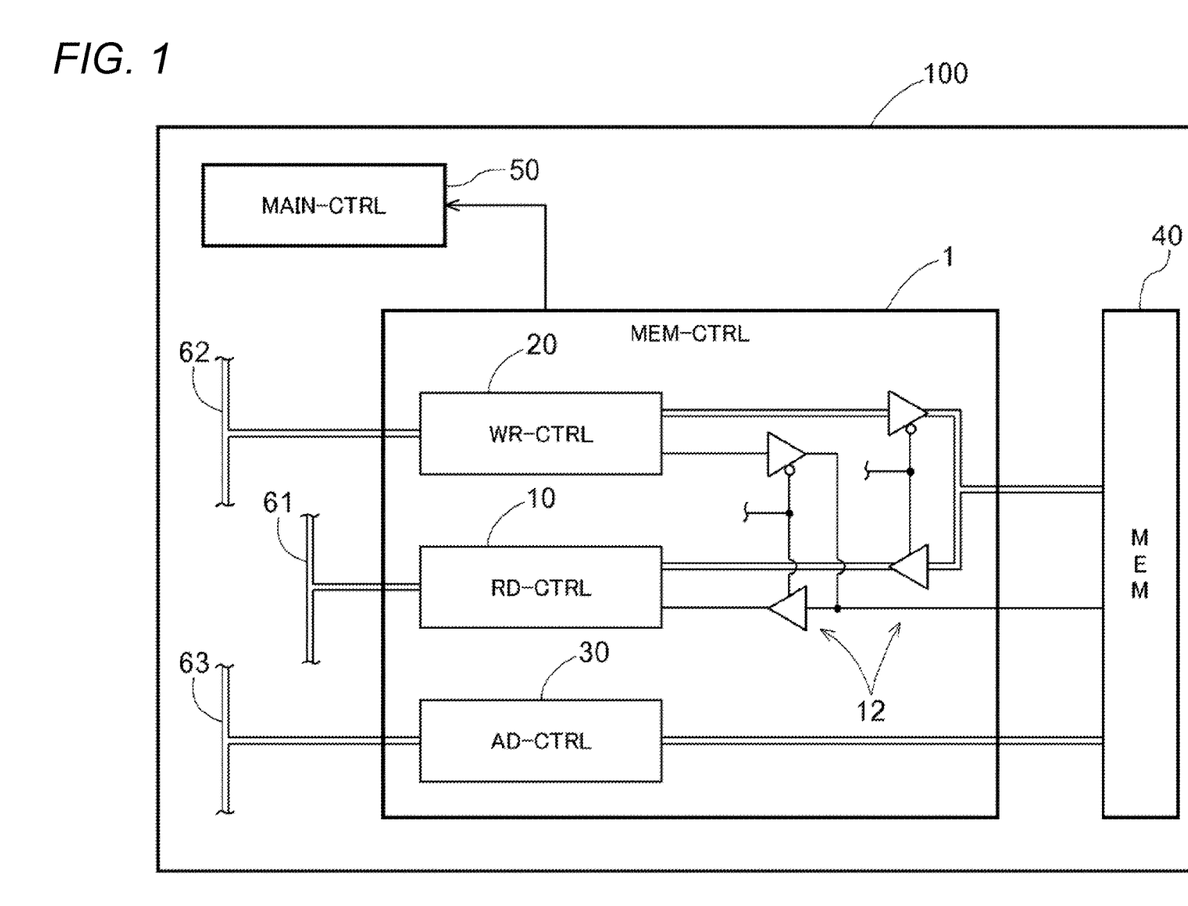
FIG. 1 is a block diagram schematically showing an exemplary configuration of a semiconductor integrated circuit.

In the following, with reference to the drawings, a description will be given of an embodiment of a memory controller. As shown in FIG. 1, a semiconductor integrated circuit 100 is a system LSI including a main controller (MAIN-CTRL) 50 as a core (for example, a CPU core), a memory (MEM) 40, and a memory controller (MEM-CTRL) 1. Note that, the semiconductor integrated circuit 100 is not limited to a system LSI, and may be a hybrid circuit such as a multichip module made up together of a plurality of semiconductor chips. The memory 40 is a volatile memory such as DRAM. The memory controller 1 is a memory interface circuit that controls write and read of data of a plurality of bits (for example, 8-bit data or 16-bit data) to and from the memory 40.

The memory controller 1 includes a read control part (RD-CTRL) 10, a write control part (WR-CTRL) 20, and an address control part (AD-CTRL) 30. The read control part 10 is a circuit that controls read of data from the memory, and outputs the data to a read data bus 61. The write control part 20 is a circuit that controls write of data received from a write data bus 62, to the memory 40. The address control part 30 is a circuit that controls the memory 40 by decoding an address received from an address bus 63.

The memory 40 and the memory controller 1 are connected to each other via an input/output buffer 12 included in the memory controller 1. When data is written to the memory 40, a data signal and a strobe signal (a write strobe signal) are output from the memory controller 1 to the memory 40 via an output buffer of the input/output buffer 12. When data is read from the memory 40, a data signal and a strobe signal (a read strobe signal) are input from the memory 40 to the memory controller 1 via an input buffer of the input/output buffer 12. Note that, the output buffer and the input buffer of the input/output buffer 12 each are a tristate output-type element, and are to be in an exclusively output-enabled state.

Figure 2:
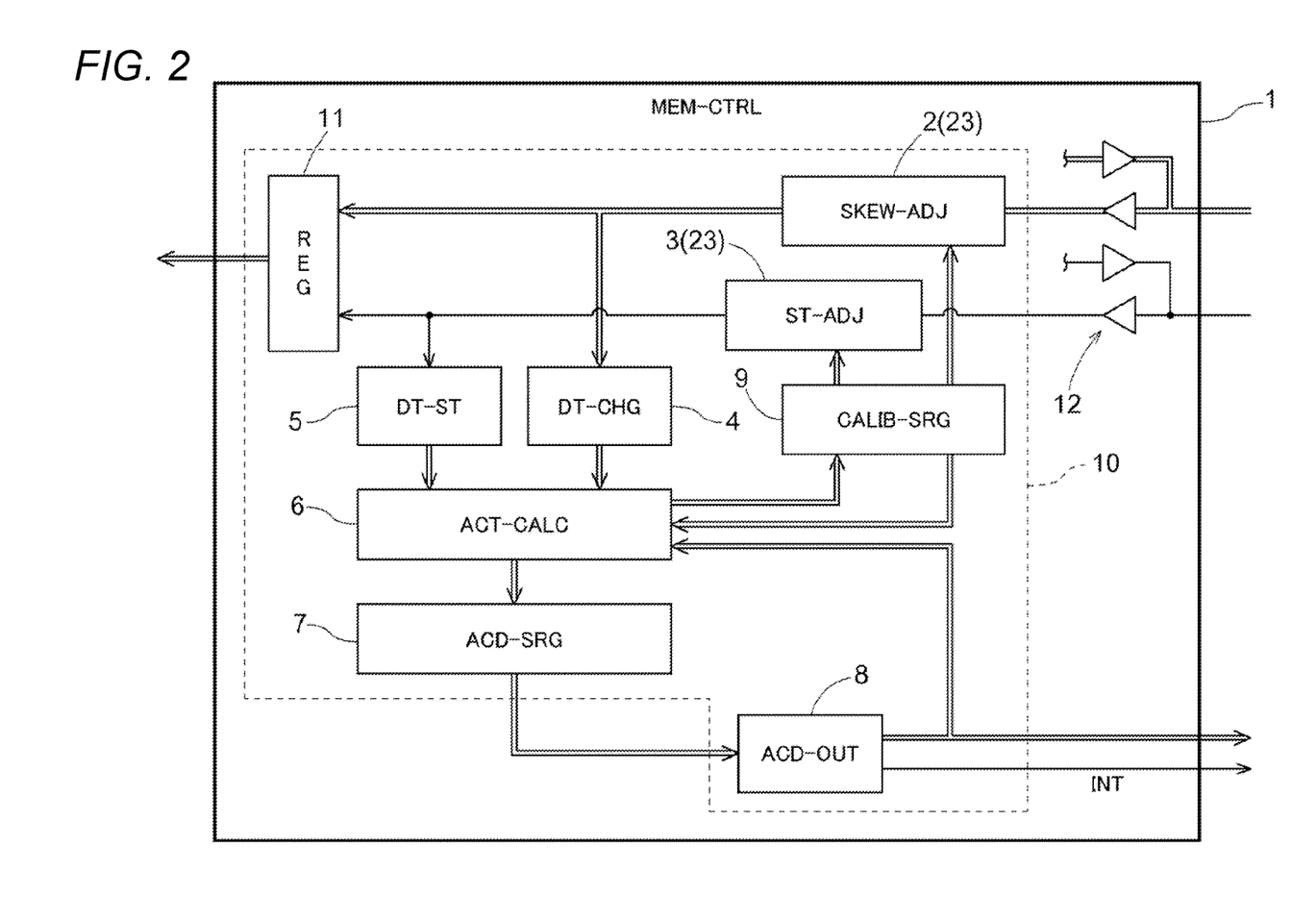
FIG. 2 is a block diagram schematically showing an exemplary configuration of a read control part.

FIG. 2 is a block diagram schematically showing a configuration around the read control part 10 of the memory controller 1. The read control part 10 includes a data skew adjustment part (SKEW-ADJ) 2, a strobe adjustment part (ST-ADJ) 3, a data change point detection part (DET-DATA) 4, a strobe point detection part (DET-ST) 5, a dynamic timing calculation part (ACD-CALC) 6, a dynamic timing information storage part (ACD-SRG) 7, a dynamic timing information output part (ACD-OUT) 8, a calibration information storage part (CALIB-SRG) 9, and a register (REG) 11. Note that, the data skew adjustment part 2 and the strobe adjustment part 3 form a timing adjustment part 23. In reading data from the memory 40, data output from the memory 40 is latched by the register 11 with a strobe signal serving as a trigger, and the data is output from the register 11 to the read data bus 61. Note that, the register 11 is made up of, for example, storage elements such as D flip-flops or D latches the number of which corresponds to the bit width of the data.

In reading data, the data skew adjustment part 2 adjusts a data skew that is the phase difference between read data signals of the plurality of bits. The data read from each memory cell of the memory 40 is independent for each bit. Accordingly, an electrical state of each signal line of the plurality of bits differs for each the signal line. The timing at which data change (a change point) from a high state (H, data value: 1) to a low state (L, data value: 0) and the timing (a change point) at which data change from L (data value: 0) to H (data value: 1) are also non-uniform. On the other hand, the strobe signal serving as the trigger for the register 11 is a signal common to all the plurality of storage elements (D flip-flops or D latches) forming the register 11. Accordingly, a timing margin between a strobe signal and each data signal differs for each read data signal.

That is, for each data signal, a change point of a data signal for a change point of a strobe signal (a strobe point SP) differs. The relationship between the data signal and the strobe point SP can be defined as, for example, a set up time and a hold time of the data signal for the strobe point SP. The set up time and the hold time differ for each data signal. In other words, a period during which a data signal is stable and that is suitable for the register 11 to latch the data (a data valid period: referred to as a window, an eye, or the like) differs for each data signal. Accordingly, the data valid period of data signals as a whole is determined by a set up time being the worst condition and a hold time being the worst condition. To maximize the data valid period as much as possible, preferably the change points of a plurality of data signals are near to each other. The data skew adjustment part 2 secures a proper data valid period by shifting the phase of each data signal as needed so as to reduce the phase difference (the data skew) between the data signals.

In consideration of the set up time and the hold time for the strobe point SP, the strobe point SP is preferably positioned near the center of the data valid period. Even when a proper data valid period is secured by the data skew adjustment part 2, an inappropriate strobe point SP impairs stability of the register 11 in latching data. The strobe adjustment part 3 adjusts the position of a strobe point SP for a data valid period. That is, the strobe adjustment part 3 adjusts a change point of a strobe signal that defines a strobe point SP, which is the timing of latching read data (a read data signal), by the change point of the signal. Note that, while it has been described that "the strobe point SP is preferably positioned near the center of the data valid period", the required hold time is often shorter than the required set up time. Accordingly, without being limited to near the center, the strobe point SP for the data valid period is preferably adjusted in accordance with the characteristic of the register 11.

The data change point detection part 4 detects data change points that are change points of data signals of a plurality of bits (read data signals), respectively. Specifically, the data change point detection part 4 detects a data change point for each of the data signals having their data skew adjusted by the data skew adjustment part 2. The strobe point detection part 5 detects a strobe point SP. Specifically, the strobe point detection part 5 detects a strobe point SP being a change point of a signal having its strobe point SP adjusted by the strobe adjustment part 3, which signal is a strobe signal provided to the register 11.

The dynamic timing calculation part 6 calculates, based on the strobe point SP and the data change point for each of the data signals (the read data signals), dynamic timing information "ACD" for the strobe point SP for each of the data signals. The dynamic timing information may be, for example, the above-described set up time and the hold time. Further, the semiconductor integrated circuit 100 and the memory controller 1 are operated by a clock signal being a reference, and a data signal is changed by the clock signal. Accordingly, the dynamic timing information may be calculated with reference to the clock signal. For example, the dynamic timing information may be defined by the time between a time point at which a data signal starts changing or ends changing in a data change point and a clock signal, and the time of a strobe signal for the clock signal. In the following, a description will be given of an exemplary mode in which the dynamic timing information is defined by the set up time and the hold time. A dynamic timing information storage part 7 stores the dynamic timing information that includes at least the set up time and the hold time. A dynamic timing information output part 8 outputs the dynamic timing information.

Note that, the dynamic timing information may include, in addition to the set up time and the hold time, the value of a data signal (1 or 0), the values representing the transition state of a data signal (000, 001, 010, 111, 110, 101, 011, 100), the time of a strobe point SP, and the like. The value of a data signal represents the value of a data signal at a strobe point SP. The values representing the transition state are exemplarily shown on a 3-bit value-by-3-bit value basis including the data values that precedes or follows a data value corresponding to a strobe point SP. For example, "010" represents the case where a data value transits from "0" to "1", and again transits to "0". The strobe point SP is in the period in which the data value is "1", and the set up time in which the data value transits from "0" to "1", and the hold time in which the data value transits from "1" to "0" are stored as being associated with the values representing the transition state.

As has been described above, the data valid period (the window, the eye) of the whole data signals of a plurality of bits is determined by the set up time being the worst condition and the hold time being the worst condition. Accordingly, the dynamic timing information storage part 7 may store, out of the set up times and the hold times of data signals of a plurality of bits, respectively, the set up time of a data signal under the worst condition and the hold time of a data signal under the worst condition. That is, for a single strobe point SP, worst timing information "WST-ACD" representing the set up time and the hold time that are the worst condition for the strobe point SP may be stored.

Such a storing manner can minimize an increase in the storage capacity of the dynamic timing information storage part 7. Note that, of course, in the case where the storage capacity of the dynamic timing information storage part 7 can be amply secured, or in other cases, the set up time and the hold time that are the worst condition may be stored for each of data signals corresponding to respective bits.

Figure 3:
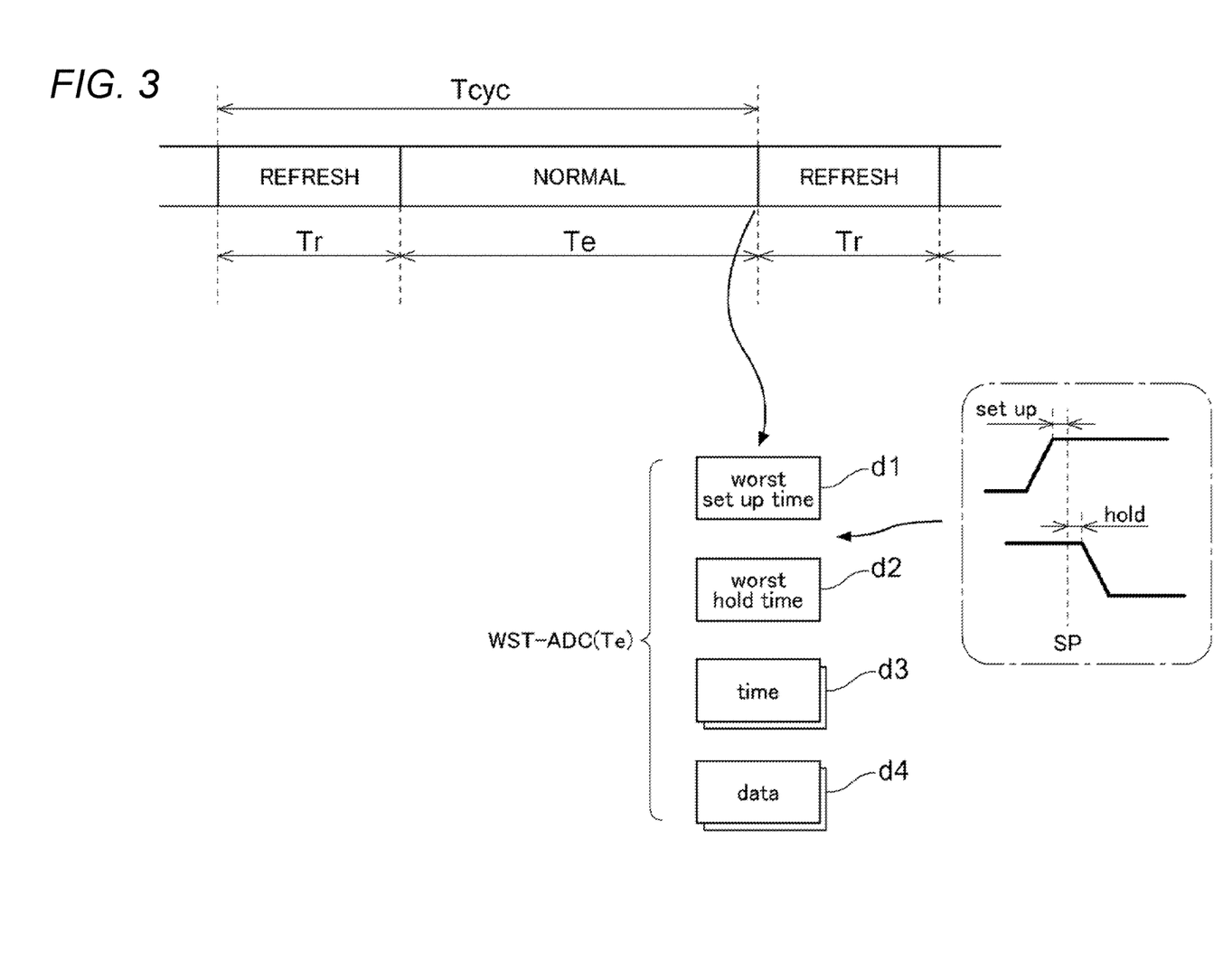
FIG. 3 is an explanatory diagram of in-evaluation period worst timing information.

Further, as shown in FIG. 3, the dynamic timing information storage part 7 may store, as in-evaluation period worst timing information "WST-ACD (Te)", worst timing information representing the worst condition for the strobe point SP within a predetermined evaluation period Te. FIG. 3 shows an exemplary case where, as the in-evaluation period worst timing information, a worst set up time d1, a worst hold time d2, a time d3 of a strobe point SP (a time of a strobe point SP corresponding to the worst set up time d1, and a time of a strobe point SP corresponding to the worst hold time d2), and a value (data) d4 representing the transition state of data (a value representing the transition state of data corresponding to the worst set up time d1, and a value representing the transition state of data corresponding to the worst hold time d2) are stored in the dynamic timing information storage part 7.

Figure 4:
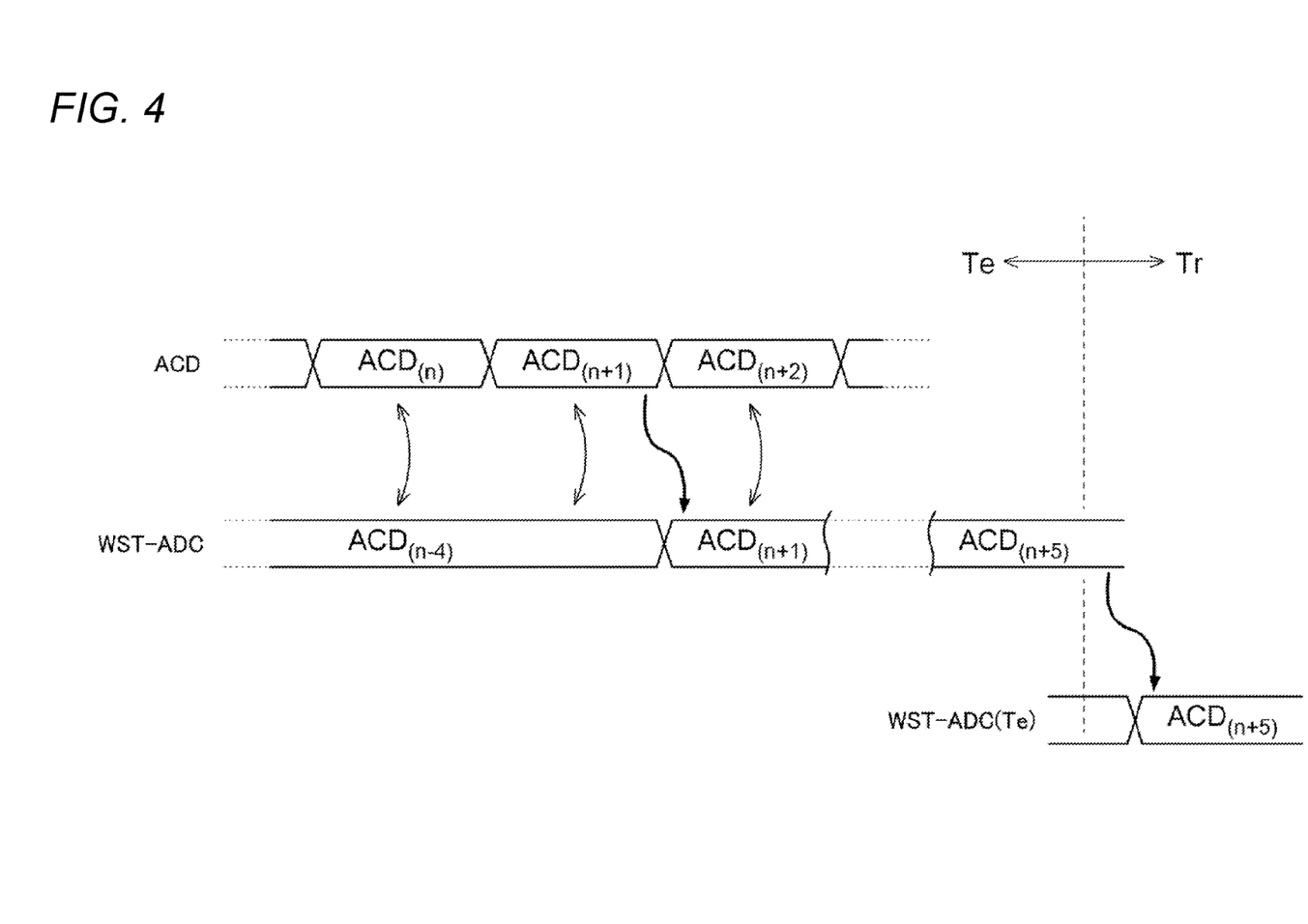
FIG. 4 is a timing chart showing an exemplary update of dynamic timing information.

Note that, as shown in FIG. 4, the in-evaluation period worst timing information is successively updated within the evaluation period Te. In FIG. 4, "$ACD_{(i)}$" represents the dynamic timing information (i: an arbitrary number). The numerical subscript in parentheses represents the order of the dynamic timing information within the evaluation period Te. For example, "$ACD_{(n)}$" represents the n-th dynamic timing information, and "$ACD_{(n-1)}$" represents the (n−1)-th dynamic timing information, namely the dynamic timing information immediately preceding "$ACD_{(n)}$". Each dynamic timing information "$ACD_{(i)}$" is compared against the worst timing information "WST-ACD" at its time point. When the dynamic timing information "$ACD_{(i)}$" is a condition worse than that of the worst timing information, the worst timing information is updated to reflect the dynamic timing information "$ACD_{(i)}$".

For example, as shown in FIG. 4, when the dynamic timing information "$ACD_{(i)}$" is "$ACD_{(n)}$", the worst timing information "$ACD_{(n-4)}$" is a worse condition, and therefore the worst timing information "WST-ACD" is not updated. When the dynamic timing information "$ACD_{(i)}$" is "$ACD_{(n+1)}$" that follows "$ACD_{(n)}$", the dynamic timing information "$ACD_{(n+1)}$" is a condition worse than that of the worst timing information "$ACD_{(n-4)}$", and therefore the worst timing information is updated to reflect "$ACD_{(n+1)}$". In this manner, successively, new dynamic timing information "$ACD_{(i)}$" is compared against the worst timing information, and the worst timing information is updated to reflect the dynamic timing information of the worse condition. That is, the dynamic timing information storage part updates and stores, as the in-evaluation period worst timing information, the worst timing information representing the set up time and the hold time that are the worst condition for a strobe point SP within the predetermined evaluation period Te. In the exemplary case shown in FIG. 4, ultimately, the dynamic timing information "$ACD_{(n+5)}$" is stored as the in-evaluation period worst timing information.

Meanwhile, as has been described above, the memory 40 is a volatile memory, and in order to retain data written to the memory, a refresh operation (REFRESH), i.e., charging, is necessarily performed over a refresh period Tr that is a predetermined time. As shown in FIG. 3, the refresh operation is repeatedly performed on a refresh cycle Tcyc that is a predetermined interval. In other words, one cycle of the refresh cycle Tcyc includes a refresh period Tr in which neither data write nor read to nor from the memory 40 are performed, and a normal operation (NORMAL) period in which data write and read to and from the memory 40 are performed. The above-described evaluation period Te is a period in which the dynamic timing between a data signal actually read from the memory 40 and a strobe signal is evaluated, and corresponds to the normal operation period. One evaluation period Te is the normal operation period in one cycle of the refresh cycle Tcyc. The dynamic timing information output part 8 outputs the dynamic timing information (the in-evaluation period worst timing information) in the refresh period Tr.

Preferably, the dynamic timing information (the in-evaluation period worst timing information) output from the dynamic timing information output part 8 is transmitted, as monitor information, to an outside of the memory controller 1, preferably to an outside of the semiconductor integrated circuit 100, via a terminal of the semiconductor integrated circuit 100. Thus, a timing margin for data actually read from the memory 40 can be properly verified from the outside of the semiconductor integrated circuit 100. Alternatively, the dynamic timing information (the in-evaluation period worst timing information) may preferably be used as correction information for correcting calibration information representing the adjustment content performed by the data skew adjustment part 2 or the strobe adjustment part 3 inside the semiconductor integrated circuit 100. Note that, the calibration information (the adjustment content) refers to, for example, an adjustment direction such as lagging or leading of the phase of a signal, or an adjustment amount in such an adjustment direction.

As shown in FIG. 2, the calibration information of the timing adjustment part 23 (the data skew adjustment part 2 and the strobe adjustment part 3) is stored in the calibration information storage part 9, and is provided from the calibration information storage part 9 to the timing adjustment part 23. Note that, the initial value of the calibration information may be determined in production, for example in the manufacturing process of the semiconductor integrated circuit 100 or in the manufacturing process of a substrate on which the semiconductor integrated circuit 100 is to be mounted, and may be stored in the calibration information storage part 9. Alternatively, the initial value of the calibration information may be determined and stored every time the semiconductor integrated circuit 100 is turned ON upon operation.

For example, every time the semiconductor integrated circuit 100 is turned ON in production or upon operation, a calibration operation is performed as one initialization processing. In the calibration operation, firstly, predetermined test data is written to the memory 40 via a write data bus 62 and a write control part 20. Next, the test data written to the memory 40 is read via a read control part 10 and a read data bus 61. In this reading, the read control part 10 acquires the above-described dynamic timing information. Then, based on the dynamic timing information, the read control part 10 determines the initial value of the calibration information. That is, the dynamic timing calculation part 6 determines the initial value of the calibration information, based on the data change point and the strobe point SP that have been detected during execution of the calibration operation.

As one aspect, the calibration information stored in the calibration information storage part 9, such as the initial value of the calibration information, is preferably updated based on the in-evaluation period worst timing information. For example, the dynamic timing calculation part 6 updates the calibration information stored in the calibration information storage part 9, based on the in-evaluation period worst timing information output from the dynamic timing information output part 8. That is, when the in-evaluation period worst timing information is a condition worse than that of the worst timing information contained in the calibration information, the dynamic timing calculation part 6 updates the calibration information, based on the in-evaluation period worst timing information.

Figure 5:
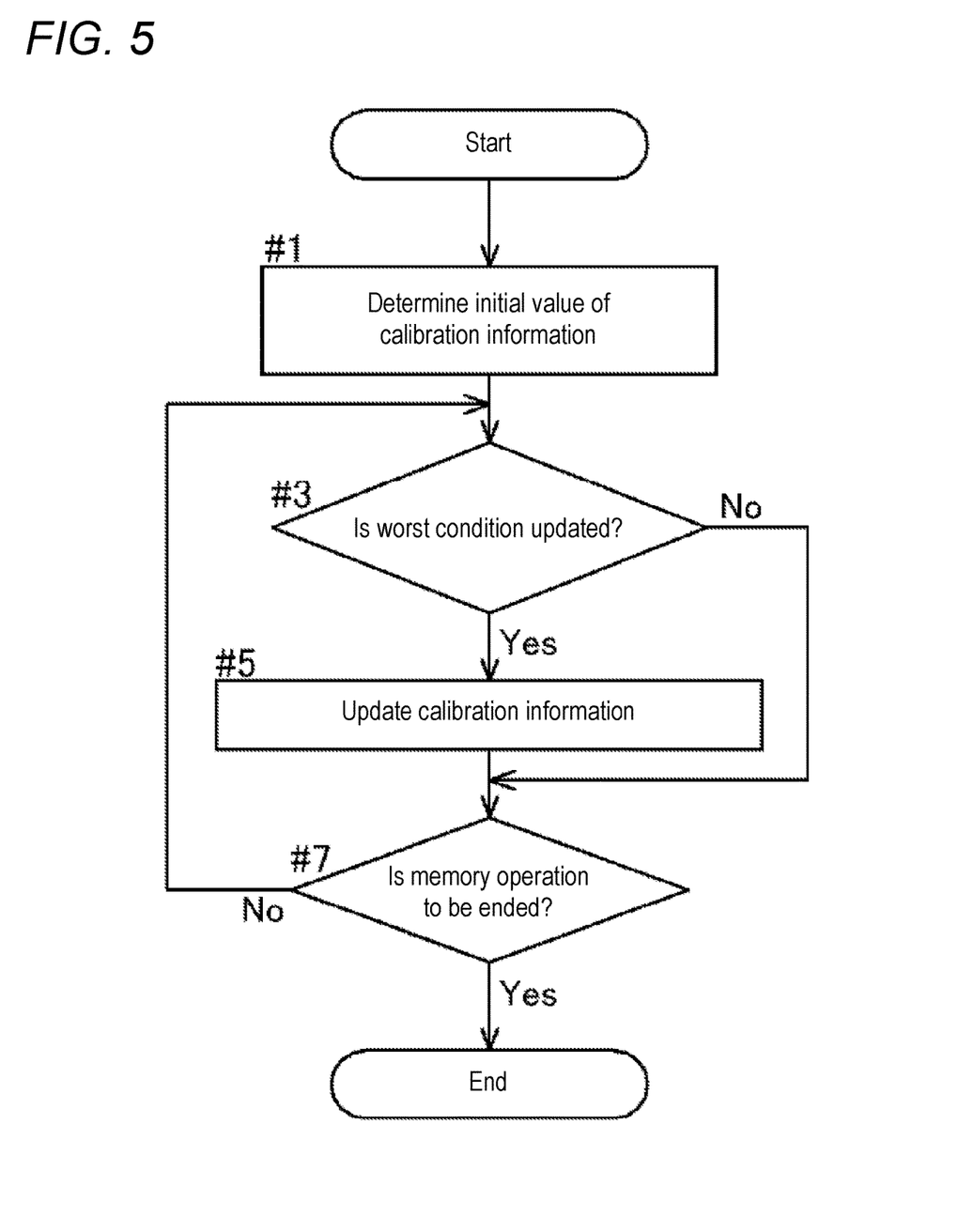
FIG. 5 is a flowchart showing an exemplary operation when a worst condition is updated.

FIG. 5 is a flowchart showing an exemplary case where the calibration operation is executed as one initialization processing every time the semiconductor integrated circuit 100 is turned ON. When the semiconductor integrated circuit 100 is turned ON, firstly the initialization processing is executed, and the initial value of the calibration information is determined (#1). Next, based on the in-evaluation period worst timing information output from the dynamic timing information output part 8, whether the worst condition has been updated is determined (#3). When the worst condition has been updated, namely when the in-evaluation period worst timing information is a condition worse than that of the worst timing information contained in the calibration information, the calibration information is updated based on the in-evaluation period worst timing information (#3: Yes→#5). When the worst condition has not been updated, the calibration information is maintained as it is (#3: No→#7). While the memory 40 continues its operation, the determination in step #3 is repeatedly performed based on new in-evaluation period worst timing information.

In the foregoing, the description has been given of the exemplary mode in which the calibration information stored in the calibration information storage part 9 is updated within the memory controller 1, based on the in-evaluation period worst timing information. However, the memory controller 1 may determine only whether the worst condition is updated and may output the determination result, and a higher-level controller such as a main controller 50, for example, may determine whether the calibration information is to be updated. For example, the dynamic timing information output part 8 outputs the dynamic timing information to the higher-level controller (50) that is higher in level than at least the memory controller 1, and when the in-evaluation period worst timing information contained in the dynamic timing information is a condition worse than that of the worst timing information contained in the calibration information, the dynamic timing information output part 8 outputs an interrupt signal to the higher-level controller (50).

Figure 6:
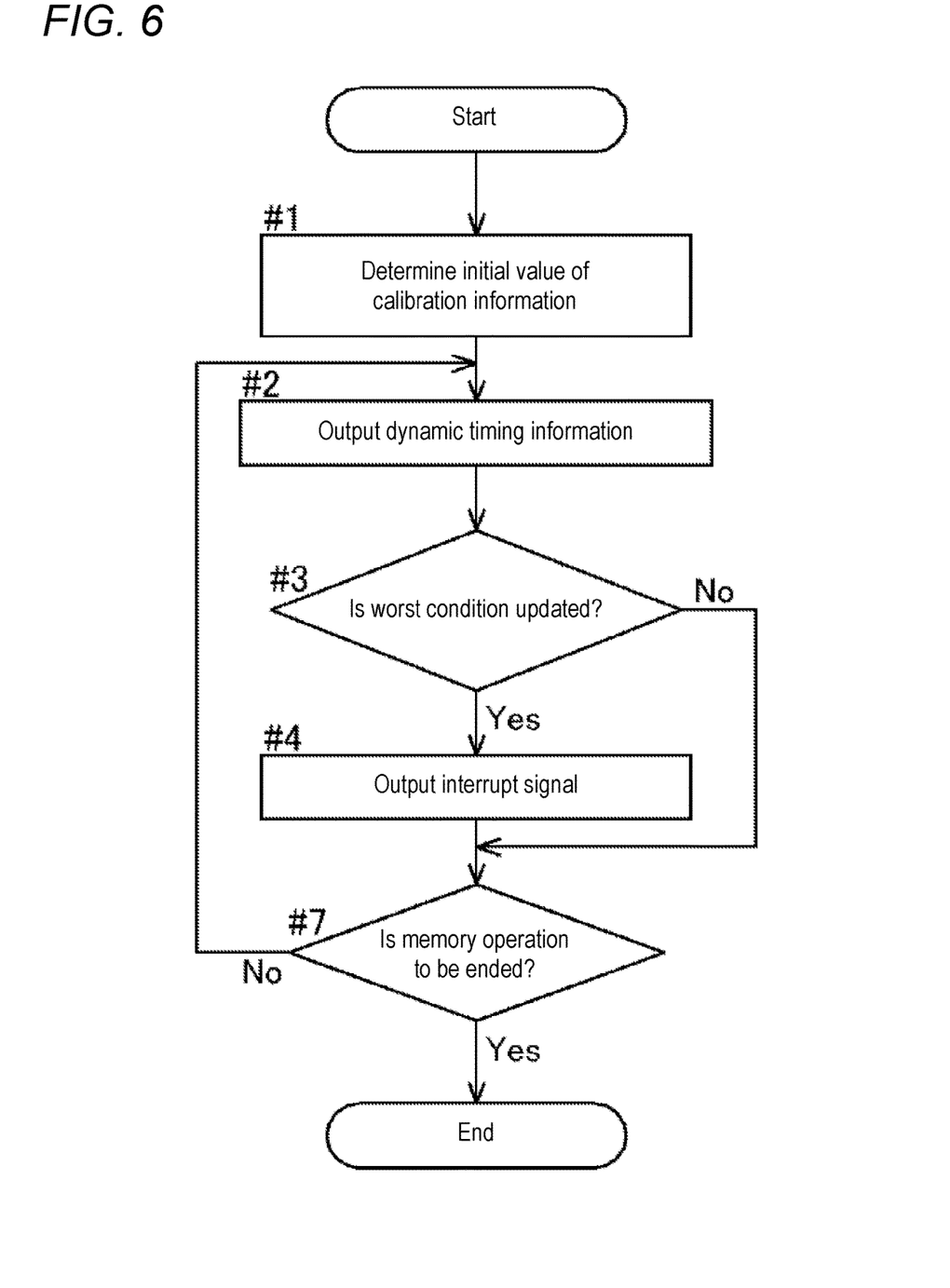
FIG. 6 is a flowchart showing another exemplary operation when a worst condition is updated.

FIG. 6 is a flowchart showing an exemplary case where such an interrupt signal is output. Similarly to the exemplary case shown in FIG. 5, when the semiconductor integrated circuit 100 is turned ON, firstly, the initialization processing is executed, and the initial value of the calibration information is determined (#1). Next, the dynamic timing information output part 8 outputs the dynamic timing information (the in-evaluation period worst timing information) to, for example, the main controller 50 (#2). Here, the dynamic timing information output part 8 determines whether the worst condition has been updated, based on the output dynamic timing information (the in-evaluation period worst timing information) (#3). When the worst condition has been updated, namely when the in-evaluation period worst timing information is a condition worse than that of the worst timing information contained in the calibration information, the dynamic timing information output part 8 also outputs the interrupt signal to, for example, the main controller 50 (#3: Yes→#4). When the worst condition has not been updated, no interrupt signal is output (#3: No→#7). While the memory 40 continues its operation, based on new in-evaluation period worst timing information, the output of the dynamic timing information in step #2 and the determination in step #3 are repeatedly performed.

The higher-level controller having received the interrupt signal, for example the main controller 50, determines whether the calibration information stored in the calibration information storage part 9 is to be updated, based on the dynamic timing information (the in-evaluation period worst timing information) output together with the interrupt signal. In the case where, for example, the timing margin becomes less than a predetermined allowable amount with an adjustment amount based on the calibration information stored in the calibration information storage part 9, the main controller 50 determines that the calibration information is to be updated. Then, the main controller 50 instructs the memory controller 1 to update the calibration information. Here, the main controller 50 may provide only the update instruction, and the memory controller 1 (the dynamic timing calculation part 6) may calculate new calibration information. Alternatively, the main controller 50 may calculate new calibration information, and may provide the new calibration information with the memory controller 1.

Figure 7:
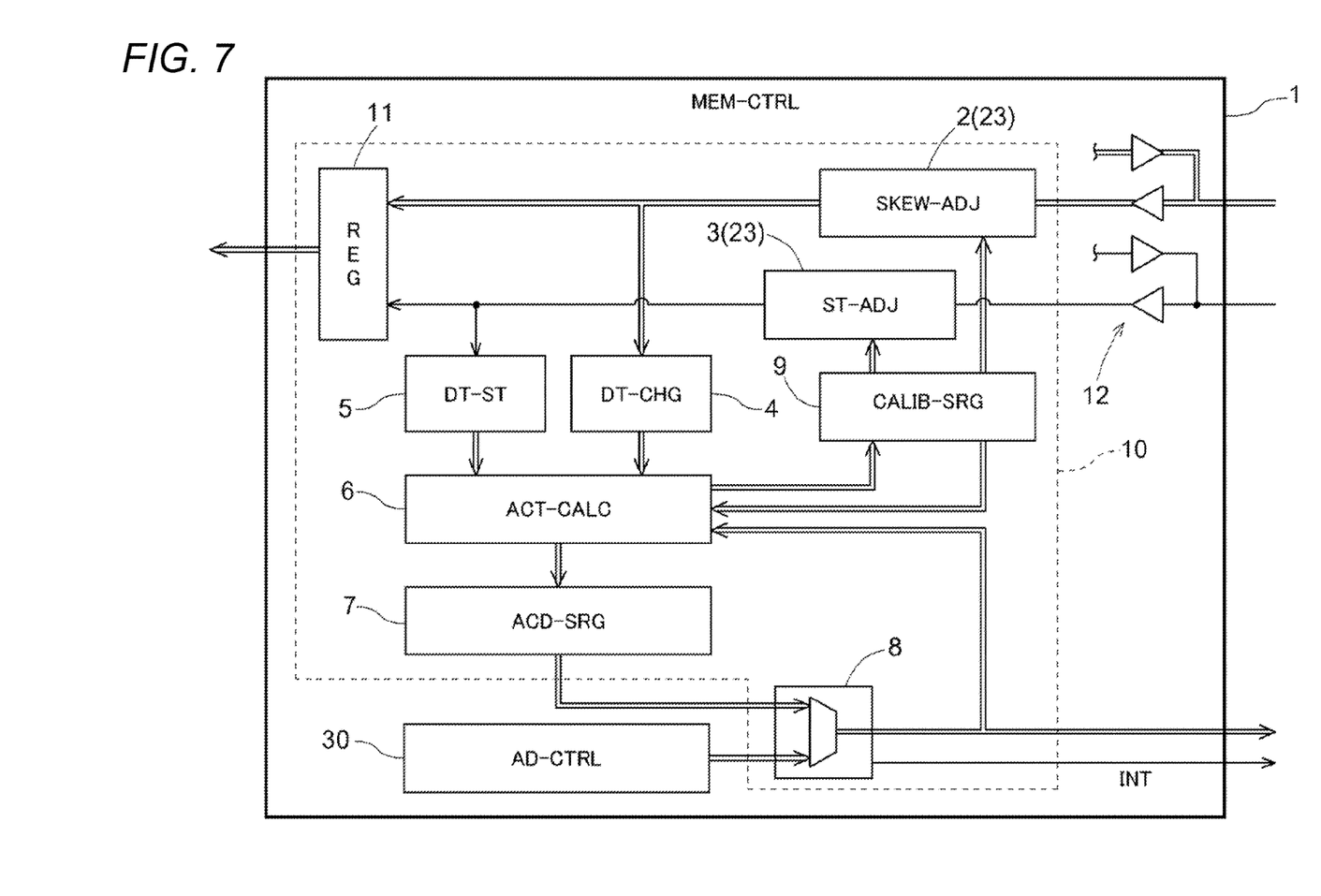
FIG. 7 is a block diagram schematically showing another exemplary configuration of a read control part.

Meanwhile, there exist numerous signal lines inside a system LSI or the like. Accordingly, when a signal line for outputting the dynamic timing information from the memory controller 1 is simply added, an increase in the wiring density can become a concern. Hence, preferably, the dynamic timing information is output using any existing signal line in a shared manner. As has been described above, with reference to FIGS. 3, 4, and others, the dynamic timing information is output in the refresh period Tr in which no access (write and read) is made to the memory 40. In the refresh period Tr, a decoded address signal is not used. Accordingly, as exemplarily shown in FIG. 7, preferably, the dynamic timing information is output by using a signal line that outputs a decoded address signal (an output signal line from the address control part 30).

Other Embodiments

In the following, a description will be given of other embodiments. Note that, the configurations of the embodiments described below each are not limited to being used alone, and may be used in combination with one another unless otherwise any inconsistency arises.

(1) In the foregoing, the description has been given of the exemplary mode for adjusting the data skew and the strobe point SP where the timing adjustment part 23 and the like are provided at the read control part 10 of the memory controller 1. However, the timing adjustment part 23 with such a configuration may also be provided at the write control part 20. The mode in which the timing adjustment part 23 and the like are provided at the write control part 20 can be readily understood by a person skilled in the art from the description of the read control part 10, and therefore, a detailed description thereof is omitted.

(2) In the foregoing, the description has been given of the exemplary mode where the initial value of the calibration information representing the adjustment content performed by the timing adjustment part 23 is determined, specifically, the mode where the initial value is stored in the calibration information storage part 9. The description has been given of the exemplary mode where, when the in-evaluation period worst timing information is a condition worse than that of the worst timing information contained in the calibration information, the calibration information is updated based on the in-evaluation period worst timing information, and the timing adjustment part 23 adjusts the data skew and the strobe point SP, based on the updated calibration information.

However, the initial value of the calibration information may not be previously determined in this manner, and the timing adjustment part 23 may adjust the data skew and the strobe point, based on the worst timing information on each occasion. That is, based on the dynamic timing information (the worst timing information) detected in the evaluation period Te, the timing adjustment part 23 may adjust the data skew and the strobe point SP in a normal operation (NORMAL) that corresponds to the next evaluation period Te.

Note that, also in the case where the initial value is not set, the calibration information storage part 9 may be provided. For example, the calibration information storage part 9 may store the calibration information based on the worst timing information, and the timing adjustment part 23 may adjust the data skew and the strobe point SP, based on the calibration information stored in the calibration information storage part 9. In the case where the initial value is not set, the calibration information is set, based on the dynamic timing information (the worst timing information) detected in the first evaluation period Te. Further, of course, also in the case where the initial value is not set, the calibration information may be updated, and the timing adjustment part 23 may adjust the data skew and the strobe point SP, based on the updated calibration information.

(3) As has been described above, the mode including the memory 40 and the memory controller 1 may not be limited to the system LSI (the semiconductor integrated circuit), and may be a multichip module including a plurality of independent chips (including a mode where the chips share the package and each provided with an independent die). In such a mode, a memory chip and a memory controller independent from each other are used, and operate with reference to their respective different clock signals. In many cases, such a memory chip usable independently for general purposes is provided with a phase adjuster for adjusting the phase difference between the clock signal of the memory controller and the clock signal of the memory chip. However, for example, a memory chip used in a smartphone with which recent years have seen proliferation often dispenses with such a phase adjuster to minimize power consumption and costs. FIG. 1 exemplarily shows the memory 40 in such a mode dispensing with a phase adjuster.

Figure 8:
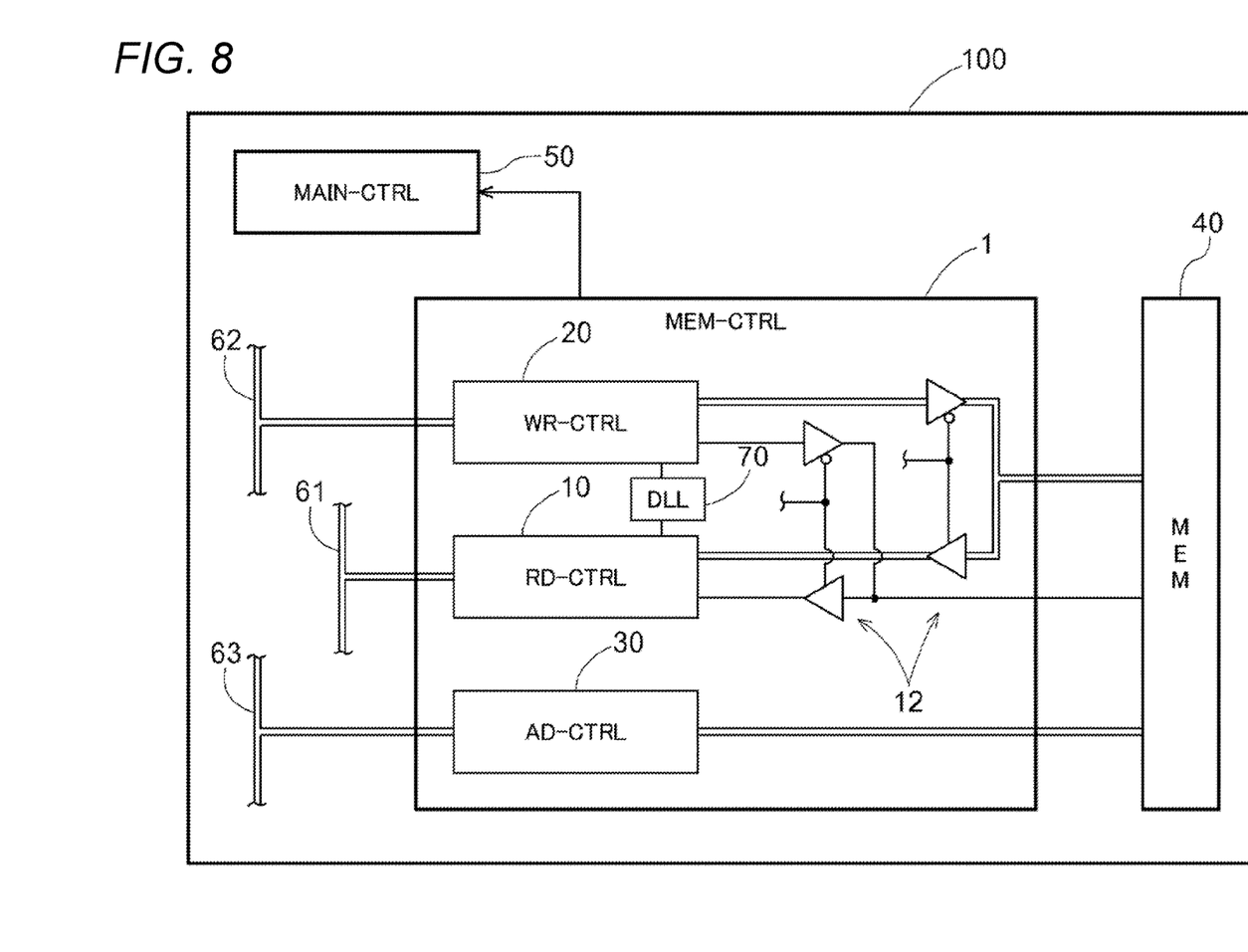
FIG. 8 is a block diagram schematically showing another exemplary configuration of a semiconductor integrated circuit.

Adding a phase adjuster to the general-purpose memory 40 means customizing, which wipes out benefits from mass production and reduces cost-effectiveness. Accordingly, the phase adjuster may preferably be added to the memory controller 1. FIG. 8 exemplarily shows the mode in which the memory controller 1 further includes a phase adjustment part (DLL) 70. As shown in FIG. 8, the phase adjustment part 70 is connected to the read control part 10 and the write control part 20, and adjusts the phase of the clock signal (an internal clock) of the memory 40 and that of the clock signal (an external clock) of the memory controller 1. Herein, the mode in which the phase adjustment part 70 is formed by a delay-locked loop (DLL) is exemplarily shown, but the phase adjustment part 70 may be formed by a phase-locked loop (PLL). A person skilled in the art can readily understand the DLL or the PLL, and therefore, a detailed description thereof is omitted.

By further including the phase adjustment part 70, the skew of a write data signal in the write control part 20 and the timing of a strobe signal are properly adjusted before being input to the memory 40. However, in the read control part 10, since no phase adjuster is provided at the memory 40, the skew of a data signal and the timing of a strobe signal are not adjusted before being input to the read control part 10. Accordingly, also in the case where the memory controller 1 includes the phase adjustment part 70, preferably the memory controller 1 includes the timing adjustment part 23 for adjusting the data skew and the strobe point SP as described above.

Overview of Embodiments

In the following, a brief description will be given of the overview of the memory controller (1) having been described above.

As one aspect, a memory controller (1) that controls write and read of data of a plurality of bits to and from a memory (40) includes: a timing adjustment part (23) including a data skew adjustment part (2) that adjusts a data skew being a phase difference between data signals, and a strobe adjustment part (3) that adjusts a change point of a strobe signal that defines a strobe point (SP) by the change point of a signal; a data change point detection part (4) that detects a data change point being a change point of each of the data signals; a strobe point detection part (5) that detects the strobe point (SP); a dynamic timing calculation part (6) that calculates, for each of the data signals, dynamic timing information based on the strobe point (SP) and the change point of each of the data signals; a dynamic timing information storage part (7) that stores the dynamic timing information; and a dynamic timing information output part (8) that outputs the dynamic timing information.

In the present configuration, the data change point detection part (4) and the strobe point detection part (5) detect the data change point and the strobe point (SP) not in a special operation mode but in a normal operation mode in which the memory (40) outputs actual data. Based on the data change point and the strobe point (SP) for the actual data, the dynamic timing information is calculated. Further, the dynamic timing information is stored, and is output from the memory controller (1). That is, the present configuration makes it possible to ascertain the strobe point (SP) for data while the memory (40) is in operation with the actual data.

As one aspect, preferably, in each of the data signals, data is changed by a clock signal being a reference, and the dynamic timing information contains a time between a time point at which each of the data signals starts changing or ends changing in the data change point and the clock signal, and a time of the strobe signal for the clock signal. This configuration allows for acquiring proper dynamic timing information with reference to a clock signal.

Further, as one aspect, preferably, the dynamic timing information contains a set up time and a hold time of each of the data signals for the strobe point. This configuration allows for acquiring proper dynamic timing information by using the set up time and the hold time.

Here, preferably, the dynamic timing information storage part (7) updates, as in-evaluation period worst timing information, worst timing information being the dynamic timing information representing a worst condition for the strobe point (SP) within a predetermined evaluation period (Te). By updating and storing the worst timing information being the worst condition, the memory controller (1) can acquire necessary information properly while an increase in the storage capacity of the dynamic timing information storage part (7) is minimized.

As one aspect, preferably, the memory (40) is a volatile memory that performs a refresh operation being charging for retaining data written to the memory (40) over a refresh period (Tr) being a predetermined time. The refresh operation is repeatedly performed on a refresh cycle (Tcyc) being a predetermined interval. One cycle of the refresh cycle (Tcyc) includes the refresh period (Tr) in which neither the write nor the read of the data to nor from the memory (40) are performed, and a normal operation period in which the write and the read of the data to and from the memory (40) are performed. The evaluation period (Te) is the normal operation period in the one cycle of the refresh cycle (Tcyc). The dynamic timing information output part (8) outputs the dynamic timing information in the refresh period (Tr).

Assigning the normal operation period as the evaluation period (Te), the strobe point (SP) for read data (a read data signal) output from the memory (40) can be properly evaluated with the memory (40) being in operation with the actual data. Further, the memory (40) cannot be used in the refresh period (Tr). Therefore, even when a load on the memory controller 1 is increased by outputting the dynamic timing information, advantageously, write and read of actual data to and from the memory (40) are not affected.

As one aspect, preferably, the timing adjustment part (23) adjusts the data skew and the strobe point, based on the worst timing information. The timing adjustment part (23) adjusts the timing under the strict condition represented by the worst timing information, and accordingly, the reliability of the operation of the memory (40) improves.

Here, preferably, the timing adjustment part adjusts the data skew and the strobe point so that the strobe point (SP) is set at a center of a valid period of each of the data signals. When the strobe point (SP) is set at the center of the valid period of each of the data signals, a stable operation is expected, and the reliability of the operation of the memory (40) improves.

Further, as one aspect, preferably, the timing adjustment part (23) adjusts the data skew and the strobe point (SP), based on calibration information representing adjustment content. The dynamic timing calculation part (6) determines an initial value of the calibration information, based on the data change point and the strobe point (SP) that are detected during execution of a calibration operation in which predetermined test data is written to and read from the memory (40), and the dynamic timing calculation part (6) updates the calibration information, based on the in-evaluation period worst timing information, when the in-evaluation period worst timing information is a condition worse than that of the worst timing information contained in the calibration information, based on the dynamic timing information output from the dynamic timing information output part (8).

In this configuration, the memory controller (1) determines whether update of the calibration information is necessary, and updates the calibration information. Accordingly, this configuration quickly improves the reliability of the timing adjustment of the memory (40).

Further, as one preferable aspect, preferably, the dynamic timing calculation part (6) determines an initial value of calibration information representing adjustment content performed by the timing adjustment part (23), based on the data change point and the strobe point (SP) that are detected during execution of a calibration operation in which predetermined test data is written to and read from the memory (40). The dynamic timing information output part (8) outputs the dynamic timing information to a higher-level controller that is higher in level than at least the memory controller (1), and when the in-evaluation period worst timing information contained in the dynamic timing information is a condition worse than a condition of the worst timing information contained in the calibration information, the dynamic timing information output part (8) outputs an interrupt signal to the higher-level controller.

This configuration makes it possible to provide, for example, a higher-level controller that is higher in level than the memory controller (1) with a criterion for determining whether update of the calibration information is necessary quickly and properly. Based on the determination in consideration of optimization of the whole system made by the higher-level controller, the reliability of the timing adjustment in data read from the memory (40) properly improves.

Further, as one aspect, preferably, the memory (40) is a simplified memory without a phase adjustment function of adjusting a phase of an internal clock being a reference of an operation on a memory cell and a phase of an external clock being a reference of an operation outside the memory (40). The memory controller (1) further includes a phase adjustment part (70) that adjusts the phase of the internal clock and the phase of the external clock.

In the case where the memory (40) and the memory controller (1) operate with reference to their respective different clock signals, preferably, a phase adjuster is provided at the memory (40). However, to minimize power consumption and costs, some memory (40) dispenses with such a phase adjuster. In this case, providing the phase adjustment part (70) at the memory controller (1) minimizes a skew of a data signal or a shift of a strobe point (SP) in data write, for example. Further, providing the timing adjustment part (23) as described above also adjusts a skew of a data signal or a shift of a strobe point (SP) in data read. Hence, the reliability of the operation of the memory (40) improves.

REFERENCE SIGNS LIST

1: Memory controller
2: Data skew adjustment part
3: Strobe adjustment part
4: Data change point detection part
5: Strobe point detection part
6: Dynamic timing calculation part
7: Dynamic timing information storage part
8: Dynamic timing information output part
23: Timing adjustment part
40: Memory
70: Phase adjustment part
SP: Strobe point
Tcyc: Refresh cycle
Te: Evaluation period
Tr: Refresh period

The invention claimed is:

1. A memory controller that controls write and read of data of a plurality of bits to and from a memory, the memory controller comprising:
a timing adjustment part including
a data skew adjustment part that adjusts a data skew being a phase difference between data signals, and
a strobe adjustment part that adjusts a change point of a strobe signal that defines a strobe point by the change point of a signal;
a data change point detection part that detects a data change point being a change point of each of the data signals;
a strobe point detection part that detects the strobe point;
a dynamic timing calculation part that calculates, for each of the data signals, dynamic timing information based on the strobe point and the data change point of each of the data signals;
a dynamic timing information storage part that stores the dynamic timing information; and
a dynamic timing information output part that outputs the dynamic timing information.

2. The memory controller according to claim 1, wherein in each of the data signals, the data is changed by a clock signal being a reference, and
the dynamic timing information contains a first time between a time point at which each of the data signals starts changing or ends changing in the data change point and the clock signal, and a second time of the strobe signal for the clock signal.

3. The memory controller according to claim 1, wherein the dynamic timing information contains a set up time and a hold time of each of the data signals for the strobe point.

4. The memory controller according to claim 1, wherein the dynamic timing information storage part stores, as in-evaluation period worst timing information, worst timing information that is the dynamic timing information representing a worst condition for the strobe point within a predetermined evaluation period.

5. The memory controller according to claim 4, wherein the memory is a volatile memory that performs a refresh operation being charging for retaining data written to the memory over a refresh period being a predetermined time,
the refresh operation is repeatedly performed on a refresh cycle being a predetermined interval,
one cycle of the refresh cycle includes the refresh period in which neither the write nor the read of the data to nor from the memory are performed, and a normal operation period in which the write and the read of data to and from the memory are performed,
an evaluation period is the normal operation period in the one cycle of the refresh cycle, and
the dynamic timing information output part outputs the dynamic timing information in the refresh period.

6. The memory controller according to claim 4, wherein the timing adjustment part adjusts the data skew and the strobe point, based on the worst timing information.

7. The memory controller according to claim 6, wherein the timing adjustment part adjusts the data skew and the strobe point so that the strobe point is set at a center of a valid period of each of the data signals.

8. The memory controller according to claim 4, wherein the timing adjustment part adjusts the data skew and the strobe point, based on calibration information representing adjustment content,
the dynamic timing calculation part determines an initial value of the calibration information, based on the data change point and the strobe point that are detected during execution of a calibration operation in which predetermined test data is written to and read from the memory, and
the dynamic timing calculation part updates the calibration information, based on the in-evaluation period worst timing information, when the in-evaluation period worst timing information is a condition worse than a condition of worst timing information contained in the calibration information, based on the dynamic timing information output from the dynamic timing information output part.

9. The memory controller according to claim 4, wherein the dynamic timing calculation part determines an initial value of calibration information representing adjustment content performed by the timing adjustment part, based on the data change point and the strobe point that are detected during execution of a calibration operation in which predetermined test data is written to and read from the memory, and the dynamic timing information output part outputs the dynamic timing information to a higher-level controller that is higher in level than at least the memory controller, and when the in-evaluation period worst timing information contained in the dynamic timing information is a condition worse than a condition of worst timing information contained in the calibration information, the dynamic timing information output part outputs an interrupt signal to the higher-level controller.

10. The memory controller according to claim 1, wherein the memory is a simplified memory without a phase adjustment function of adjusting a phase of an internal clock of a memory cell and a phase of an external clock being a reference of an operation outside the memory, and the memory controller further comprises a phase adjustment part that adjusts the phase of the internal clock and the phase of the external clock.

11. The memory controller according to claim 2, wherein the dynamic timing information contains a set up time and a hold time of each of the data signals for the strobe point.

12. The memory controller according to claim 2, wherein the dynamic timing information storage part updates, as in-evaluation period worst timing information, worst timing information being the dynamic timing information representing a worst condition for the strobe point within a predetermined evaluation period.

13. The memory controller according to claim 12, wherein the memory is a volatile memory that performs a refresh operation being charging for retaining data written to the memory over a refresh period being a predetermined time, the refresh operation is repeatedly performed on a refresh cycle being a predetermined interval, one cycle of the refresh cycle includes the refresh period in which neither the write nor the read of the data to nor from the memory are performed, and a normal operation period in which the write and the read of data to and from the memory are performed, an evaluation period is the normal operation period in the one cycle of the refresh cycle, and the dynamic timing information output part outputs the dynamic timing information in the refresh period.

14. The memory controller according to claim 12, wherein the timing adjustment part adjusts the data skew and the strobe point, based on the worst timing information.

15. The memory controller according to claim 14, wherein the timing adjustment part adjusts the data skew and the strobe point so that the strobe point is set at a center of a valid period of each of the data signals.

16. The memory controller according to claim 12, wherein the timing adjustment part adjusts the data skew and the strobe point, based on calibration information representing adjustment content, the dynamic timing calculation part determines an initial value of the calibration information, based on the data change point and the strobe point that are detected during execution of a calibration operation in which predetermined test data is written to and read from the memory, and the dynamic timing calculation part updates the calibration information, based on the in-evaluation period worst timing information, when the in-evaluation period worst timing information is a condition worse than a condition of worst timing information contained in the calibration information, based on the dynamic timing information output from the dynamic timing information output part.

17. The memory controller according to claim 12, wherein the dynamic timing calculation part determines an initial value of calibration information representing adjustment content performed by the timing adjustment part, based on the data change point and the strobe point that are detected during execution of a calibration operation in which predetermined test data is written to and read from the memory, and the dynamic timing information output part outputs the dynamic timing information to a higher-level controller that is higher in level than at least the memory controller, and when the in-evaluation period worst timing information contained in the dynamic timing information is a condition worse than a condition of worst timing information contained in the calibration information, the dynamic timing information output part outputs an interrupt signal to the higher-level controller.

18. The memory controller according to claim 2, wherein the memory is a simplified memory without a phase adjustment function of adjusting a phase of an internal clock of a memory cell and a phase of an external clock being a reference of an operation outside the memory, and the memory controller further comprises a phase adjustment part that adjusts the phase of the internal clock and the phase of the external clock.

* * * * *